(12) United States Patent
Nagano et al.

(10) Patent No.: US 6,917,637 B2
(45) Date of Patent: Jul. 12, 2005

(54) COOLING DEVICE FOR LASER DIODES

(75) Inventors: Kazuhiko Nagano, Kaisei-machi (JP); Yoji Okazaki, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 44 days.

(21) Appl. No.: 10/270,164

(22) Filed: Oct. 15, 2002

(65) Prior Publication Data

US 2003/0086454 A1 May 8, 2003

(30) Foreign Application Priority Data

Oct. 12, 2001  (JP) ........................... 2001-315461

(51) Int. Cl.$^7$ .................................................. H01S 3/04
(52) U.S. Cl. ....................................... 372/35; 372/36
(58) Field of Search .................................. 372/34–36

(56) References Cited

U.S. PATENT DOCUMENTS

| | | | | |
|---|---|---|---|---|
| 4,791,634 A | * | 12/1988 | Miyake ........................ | 372/34 |
| 5,105,430 A | * | 4/1992 | Mundinger et al. ........... | 372/35 |
| 5,309,457 A | * | 5/1994 | Minch ......................... | 372/34 |
| 5,598,632 A | * | 2/1997 | Camarda et al. ........ | 29/890.032 |
| 6,172,997 B1 | * | 1/2001 | Miyake et al. ................ | 372/36 |
| 6,288,417 B1 | * | 9/2001 | Nickel et al. ................ | 257/103 |
| 6,292,499 B1 | * | 9/2001 | Pearson et al. ................ | 372/36 |
| 6,385,226 B2 | * | 5/2002 | McMinn et al. .............. | 372/50 |
| 6,388,317 B1 | * | 5/2002 | Reese ......................... | 257/713 |
| 6,517,221 B1 | * | 2/2003 | Xie ............................ | 362/373 |
| 6,603,793 B2 | * | 8/2003 | Vetrovec ...................... | 372/95 |
| 6,625,193 B2 | * | 9/2003 | Vetrovec ...................... | 372/70 |
| 6,643,302 B1 | * | 11/2003 | Nishikawa et al. ........... | 372/35 |
| 6,676,306 B2 | * | 1/2004 | Ikeda et al. ................... | 385/92 |
| 6,690,696 B2 | * | 2/2004 | Byren et al. .................. | 372/35 |
| 2003/0164231 A1 | * | 9/2003 | Goodson et al. ....... | 165/104.11 |

* cited by examiner

*Primary Examiner*—Tuyet Vo
*Assistant Examiner*—Hung Tran Vy
(74) *Attorney, Agent, or Firm*—Sughrue Mion, PLLC

(57) ABSTRACT

A cooling device for laser diodes comprising a stem which comprises a 2 mm thick Cu substrate having thereon an array of grooves extending to the resonator length of a laser diode device with a width of 50 μm and a depth of 300 μm and a 100 μm thick Cu cover plate for hermetically sealing the grooved surface by, e.g. soldering. The groove contains a working fluid of deionized water filled under reduced pressure, forming a heat pipe. A plurality of heat pipes is created to form a heat pipe array. Forty GaN laser diode devices each having five light-emitting areas, each of which has an optical power of 100 mW, are mounted with junction-down on the upper surface of cover plate, forming a bar laser with a total output of approximately 20 W.

10 Claims, 9 Drawing Sheets

COOLING DEVICE FOR LASER DIODES

BACKGROUND OF THE INVENTION

1. Field of the Invention

The present invention relates to a cooling device for laser diodes.

2. Description of the Related Art

Forced water-cooling mechanisms and micro fluid channel water-cooling mechanisms are widely used as cooling mechanisms for a block on which a laser diode is mounted. The former can ensure its heat transport capacity by employing a pipe with a larger diameter and increasing its flow rate. The diameter of the pipe, however, needs to be at least 3 mm to reduce the internal frictional resistance and to ensure an increased water flow rate. In addition, installation of a water-cooling section inside the block inevitably results in the water-cooling section being separated from the microscopic light-emitting spot of the laser diode by a distance of about 2 mm. Thus, it is difficult for the cooling section to cool the area in the vicinity of the microscopic light-emitting spot of the laser diode. In contrast, the latter can adopt a design utilizing a fluid channel of a smaller diameter, so that it can cool the area in the vicinity of the light-emitting spot of the laser diode. But it can not provide a large flow volume due to the smaller diameter of the fluid channel. It is contemplated, therefore, to provide an increased flow rate by increasing the working pressure of the coolant. However, the smaller diameter of the fluid channel inevitably has a limitation with regard to its flow rate. Increased flow rate results in heat generation by the viscosity resistance friction against the inner wall of the fluid channel, resulting in a reduced cooling effect. Thus, for a high-power infrared bar laser of the 60 W class, in which the amount of heat dissipation is about 100 W, the heat dissipation density provided by the water-cooling mechanism is limited to about 1 kW/cm$^2$.

Meanwhile, a heat pipe composed of a decompressed airtight tubular container made of, e.g., copper, in which a working fluid is sealed is also known. In the heat pipe, the working fluid evaporates when the heat pipe is partially heated and the vapor (evaporated working fluid) moves through the pipe to a low temperature section of the heat pipe where the vapor condenses, thus the heat is transported by the working fluid. In particular, a small heat pipe with a diameter of not exceeding 3 mm, which is also referred to as a micro heat pipe, has recently been developed and is in practical use as a cooling device for electronic devices such as laptop computers.

The bore diameter of the heat pipe employed in electronic devices is about as large as 2 mm. Also, it is contemplated that the heat pipe is attached, by fixtures or soldering, to a structure such as a stem, and is used in conjunction with heat dissipation fins or other cooling means. Thus, it is difficult to place the heat pipe in the vicinity of the microscopic light emitting spot of a high-power laser diode and cool the high density heat generated thereby.

Also, the bore diameter of a conventional heat pipe is at least 2 mm and the heat transport capacity of a single heat pipe per unit of cross-sectional area is about 150 to 250 mW/cm$^2$, which is reduced by about ½ to 150 mW/cm$^2$ at the maximum when surrounding structures are included. Also, using fixtures or solder results in an increased contact surface of metals, causing an increased junction thermal resistance. In particular, it is anticipated, in the future, that heat generation density will increase due to the trends toward, for example, higher-power laser diodes, higher density packaging or use of ultraviolet light beams. Therefore, the conventional cooling mechanisms are not appropriate for accommodating these future needs. For example, the electro-optical conversion efficiency of a GaN laser is about 15%, which corresponds to ½ to ⅓ of an infrared laser. Further, the GaN laser has a high light absorption coefficient, limiting the resonator length to 50 to 60% of the infrared laser. In order to obtain a comparable optical power of the conventional 60 W class infrared laser from a GaN laser, a heat dissipation mechanism capable of accommodating heat dissipation density 10 or more times as greater as that of a conventional heat pipe must be realized. Thus, it is necessary to realize a cooling mechanism capable of providing efficient thermal diffusion and a cooling capacity for high density heat at a microscopic spot of the laser diode.

SUMMARY OF THE INVENTION

In view of the circumstances described above, it is an object of the present invention to provide a cooling device for laser diodes which is capable of providing efficient thermal diffusion of the heat from the area in to the vicinity of the microscopic light-emitting spot of a laser diode, thereby improving the reliability of the laser diode.

The cooling device for laser diodes of the present invention comprises a structure on which at least one laser diode is directly mounted, wherein said structure has therein a heat pipe or pipes made of microscopic fluid channels located in close proximity to the laser diode.

The structure may comprise a substrate having an array of microscopic parallel grooves thereon to form a heat pipe or pipes and a cover plate for hermetically sealing the grooved surface and for mounting the laser diode thereon.

Preferably, the thickness of the cover plate on which the laser diode is mounted does not exceed 300 μm to provide high heat dissipation and ensures sufficient flatness for accurate mounting of the laser diode. It is further preferable that the thickness of the cover plate is less than or equal to 100 μm which allows the heat pipe or pipes to be located in closer proximity to the heat source and provides higher heat dissipation.

The structure may be a substrate having an array of microscopic parallel grooves on its bottom surface with the distance between the bottom of the grooves and the upper surface of the substrate is less than or equal to 300 μm to form a heat pipe or pipes and the laser diode is mounted thereon; and a cover block for hermetically sealing the grooved surface.

Preferably, both the width and depth of the grooves are between 30 to 400 μm.

It is further preferable that the width of the grooves is between 30 to 100 μm and the depth of the grooves is between 100 to 400 μm.

The laser diode may comprise a GaN semiconductor.

The laser diode may have a plurality of light-emitting areas on a single element.

The laser diode may have a broad light-emitting area, wherein the "broad" typically means a light emitting width of not less than 10 μm.

A plurality of laser diodes may be mounted in parallel.

The cooling device for laser diodes of the present invention comprises a structure on which at least one laser diode is directly mounted and has therein a heat pipe or pipes made of microscopic fluid channels located in close proximity to the laser diode so that it can efficiently transport the high density heat of the laser diode. Specifically, conventional heat pipes or other cooling means are customarily attached by fixtures or solder to a structure such as a stem on which a laser diode is directly mounted, causing an increased junction thermal resistance due to an increase in unnecessary contact surface of metals so that they are not suitable for an application which requires efficient heat dissipation of a laser diode. The cooling device for laser diodes according to the present invention is provided with built-in heat pipe or pipes inside a structure, making the unnecessary contact surface extremely small. In addition, the heat pipe or pipes are located in close proximity to the laser diode, so that it can provide a cooling capability to the area in the vicinity of the microscopic light-emitting spot of the laser diode.

When the structure comprises a substrate having an array of microscopic parallel grooves thereon to form a heat pipe or pipes and a cover plate for hermetically sealing the grooved surface and for mounting the laser diode thereon, the microscopic grooves are readily formed with conventional techniques such as the micro-fabrication technique so that the heat pipe or pipes can be accurately built into the substrate.

Employment of a cover plate with a thickness of less than or equal to 300 µm results in the heat pipe or pipes being located in close proximity to the laser diode, thereby efficient heat dissipation can be provided. At the same time, said cover plate provides sufficient flatness and strength for accurately mounting the laser diode at a predetermined position on the upper surface of the cover plate so that the laser diode can be mounted with high accuracy.

Further, when the thickness of the cover plate is less than or equal to 100 µm, the distance between the heat pipe or pipes and the laser diode becomes shorter and more efficient heat dissipation can be provided.

Further, when the structure comprises a substrate having an array of microscopic parallel grooves on its bottom surface to form a heat pipe or pipes and a cover block for hermetically sealing the grooved surface, wherein the laser diode is mounted on the upper surface of the substrate, and the grooves are formed so as to the distance between the bottom of the grooves and the upper surface of the substrate is 300 µm, the substantially flat upper surface of the substrate can be used as the surface for mounting the laser diode so that the deterioration of the reliability of the laser diode due to strain can be avoided. The aforementioned method is further advantageous when compared with a method in which an upper surface with grooves is sealed by a cover plate on which a laser diode is mounted, in that it can provide increased inner surface area, i.e. higher heat transport capacity, resulting in an improved heat dissipation property and a more accurate laser beam. In addition, the grooves can be formed in closer proximity to the laser diode with the micro-fabrication technique so that greater heat dissipation can be provided.

If the heat pipes are too small, the resistance of the inner wall of the heat pipes increases and the fluidity of the working fluid inside the grooves is hindered. It is preferable, therefore, that both the width and depth of the grooves are not smaller than 30 µm to facilitate the fluidity of the working fluid inside the grooves.

It is also preferable that the heat pipes having a heat dissipation capability ten times that of Cu per unit cross-sectional area is located in utmost proximity to the heat source. A larger cross-sectional area of the heat pipes requires the structure design with thicker walls in the vicinity of the heat pipes, which keeps the heat pipes away from the heat source, thus resulting in an inefficient heat dissipation capability. In particular, the cooling device for a high-power laser diode, the dissipation of the heat from the heat source spot is important. In order to locate the heat pipe or pipes in close proximity to the laser diode with a distance of approximately 300 µm or less, it is preferable that both the width and the depth of the grooves do not exceed 400 µm.

Further, it is preferable that the width of the grooves is greater than or equal to 30 µm to allow a plurality of grooves to be created in parallel so that high heat dissipation can be obtained and to ensure the fluidity of the working fluid inside the grooves. In addition, it is preferable that the width of the grooves does not exceeds 100 µm to prevent strain from developing on the surface of the structure on which the laser diode is mounted. At the same time, it is preferable that the depth of the grooves is between 100 to 400 µm to provide a wider specific surface area to which a unit mass of the working fluid contacts, thereby ensuring increased flow-back efficiency.

When the laser diode is a GaN semiconductor, it emits a blue or a shorter wavelength light beam. It has low current-light conversion efficiency and a high light absorption coefficient, limiting the resonator length, so that its heat generation density is 4 to 6 times greater than that of an infrared laser diode for generating an equivalent output. Therefore, it is further preferable to apply the cooling device for laser diodes according to the present invention to the aforementioned application because of its high heat transport capacity.

Further, it is preferable to apply the cooling device for laser diodes according to the present invention to a laser diode having a plurality of light-emitting areas which generates higher density heat.

Further, it is preferable to apply the cooling device for laser diodes according to the present invention to a laser diode having a broad light-emitting area, because it oscillates a high power laser beam and generates a larger amount of heat.

Further, it is also preferable to apply the cooling device for laser diodes according to the present invention to a plurality of laser diodes mounted in parallel, because it can dissipate a large amount of higher density heat.

DESCRIPTION OF THE PREFERRED EMBODIMENTS

Hereinafter, preferred embodiments of the present invention will be described in detail with reference to the accompanying drawings.

Figure 1:
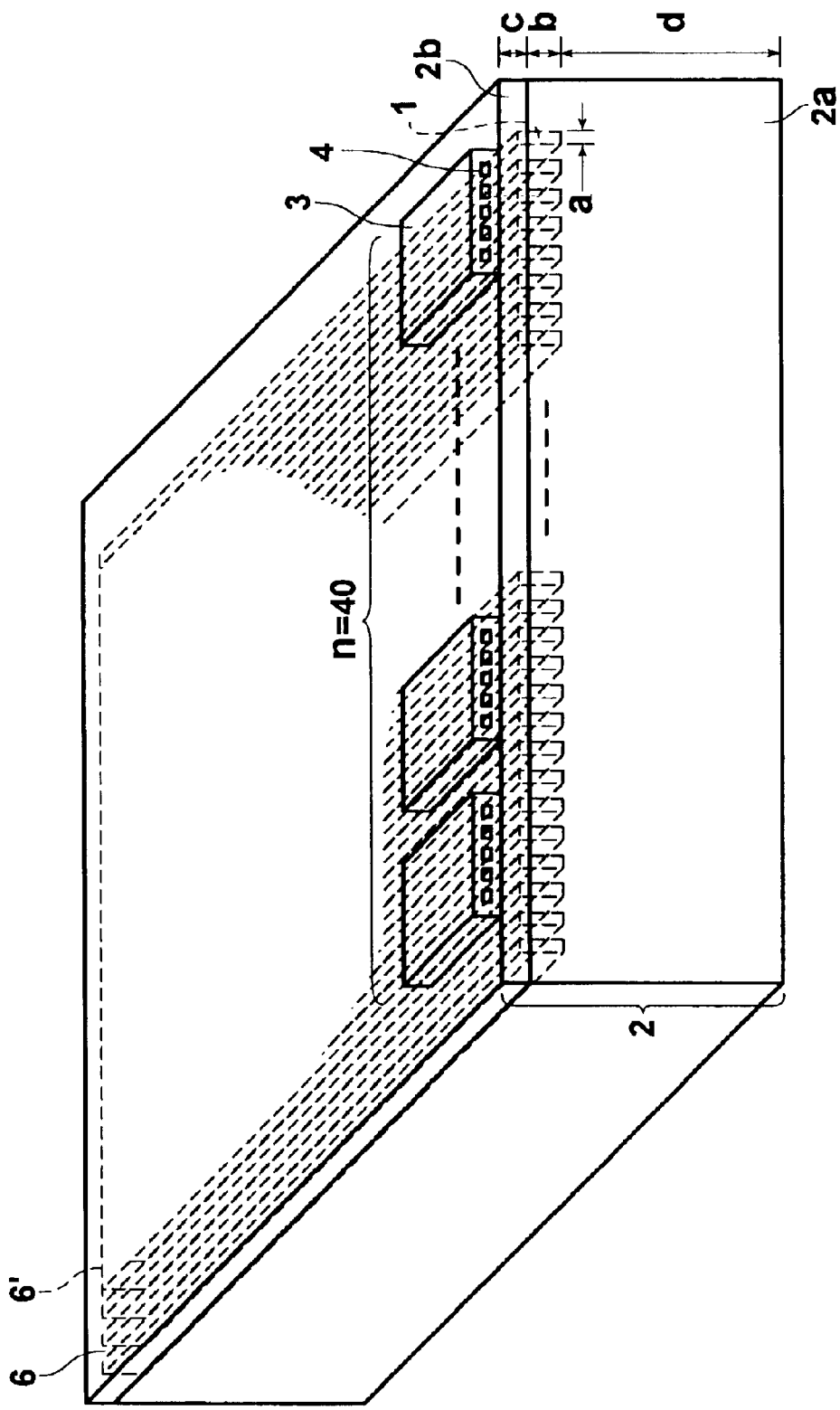
FIG. 1 is a perspective view illustrating a schematic configuration of a cooling device for laser diodes according to a first embodiment of the invention.
Figure 2A:
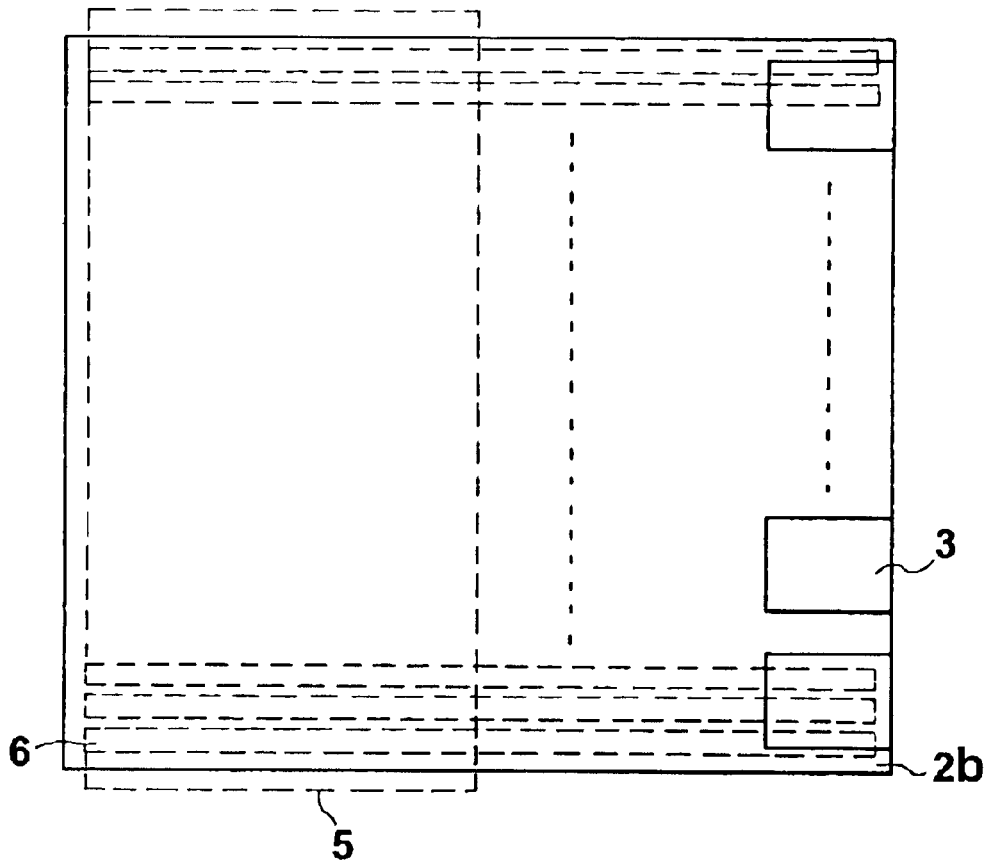
FIG. 2A is a top view and FIG. 2B is a side view illustrating a schematic configuration of a cooling device for laser diodes according to a first embodiment of the invention.
Figure 2B:
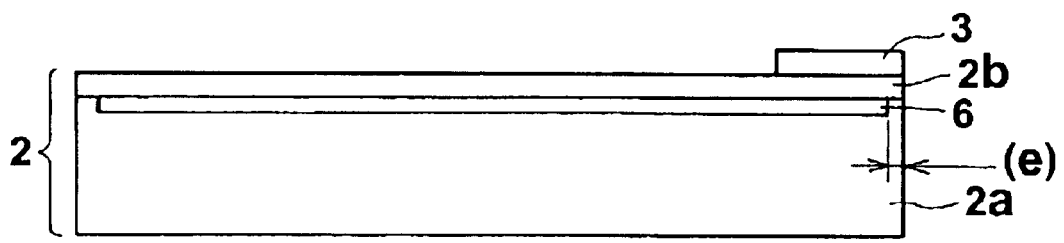

First, the description of the cooling device for laser diodes in accordance with a first embodiment of the present invention will be provided herein below. FIG. 1 is a perspective view illustrating a schematic configuration of the cooling device for laser diodes of the first embodiment. FIG. 2A is a top view and FIG. 2B is a side view thereof.

As shown in FIG. 1, the cooling device for laser diodes of the first embodiment comprises a stem 2 which comprises a substrate 2a (approximately 20 mm thick) made of Cu having thereon an array of parallel grooves 1, which extend in the direction of the resonator length of the laser diode device 3 with a width (a) of 50 μm and a depth (b) of 300 μm, and a Cu cover plate 2b of 100 μm thickness (c), which is hermetically sealed on the grooved surface by, e.g. soldering. The groove 1 contains deionized water as a working fluid filled therein under reduced pressure, thus forming a heat pipe 6. As a whole, the cooling device is structured in a heat pipe array 6' composed of a plurality of heat pipes 6 formed in parallel within the stem 2. Preferably, the grooves 1 are created with the distance between the bottom of the grooves 1 and the bottom surface of the substrate 2a being approximately 20 mm (d). In addition, as shown in FIG. 2B, it is also preferable that the grooves 1 are located as close as 100 μm to the lateral face of the substrate 2a on the side closer to the laser emitting face of the laser diode device 3 to locate the groove 1 in close proximity to the light-emitting spot of the laser diode device 3. Forty laser diode devices 3 made of GaN semiconductor each having five light-emitting areas 4, each of which has an optical power of 100 mW, are mounted on the upper surface of a cover plate 2b with junction-down, forming a bar laser with a total output of approximately 20 W. A single chip width of the laser diode device 3 is approximately 200 μm and the total width of 40 chips being laid out is approximately 10 mm, and the resonator length is approximately 500 to 600 μm.

The uppermost part of the grooves 1 on the substrate 2a, that is, the portion of the upper surface of the substrate 2a where the cover plate 2b is bonded has a high flatness level of 0.5 μm, wherein the "flatness level" means a vertical interval between the most protruded point and the most depressed point of irregularities of the surface.

As shown in FIG. 2A, in the cooling device for laser diodes of the first embodiment, the deionized water as the working fluid inside the heat pipe 6 located in close proximity to the laser diode device 3 evaporates by the heat generated by the laser diode device 3. Then, the evaporated deionized water diffuses through the heat pipe 6 to a low temperature section 5 where the vapor condenses onto the inner wall of the heat pipe 6. Thereafter, the liquefied deionized water returns to a high temperature section (around the laser diode device 3) by capillary action. Deionized water is continuously supplied to the high temperature section by capillary action and the deionized water, in turn, transports the heat generated by the laser diode device 3.

The practical heat transport capacity of a conventional heat pipe with a bore diameter of 3 mm is 140 to 180 W/cm$^2$, whereas the cooling device of the first embodiment can provide a heat transport capacity of about 2 kW/cm$^2$, which is approximately ten times greater than that of the conventional heat pipe. Thus, it can provide efficient heat dissipation and transport capabilities for high density heat in the vicinity of the light-emitting spot of the bar laser made of GaN semiconductor with total power of 20 W, and ensure highly reliable laser beams.

The grooves 1 are created by dry or wet etching of a mask of the groove pattern formed on the upper surface of the substrate 2a. These microscopic grooves can readily be created by the use of current micro-fabrication techniques which are capable of creating a groove of submicron width.

Employment of a 100 μm thick (c) plate as the cover plate 2b allows the heat pipe or pipes to be located in close proximity to the laser diode device 3. Also, the uppermost part of the grooves 1 on the substrate 2a, that is, the portion of the upper surface of the substrate 2a where the cover plate 2b is bonded has a high flatness level of 0.5 μm so that the surface of the substrate 2b on which the laser diode device 3 is mounted can also have a high flatness level.

Preferably, the thickness of the cover plate 2b(c) does not exceed 300 μm, wherein high heat dissipation and a sufficient flatness level for securing the reliability of the laser diode are ensured. It is further preferable that the thickness of the cover plate 2b(c) does not exceed 100 μm, in which case, as shown in this embodiment, a high flatness level can be ensured for the surface on which the laser diode device 3 is mounted after the cover plate 2b is bonded on the substrate 2a by improving the flatness level of the uppermost part of the grooves 1 on the substrate 2a, that is, the portion of the upper surface of the substrate 2a where the cover plate 2b is bonded.

The substrate 2a has a thickness of 20 mm so that it can provide high heat dissipation. A thicker substrate provides a higher heat dissipation capability.

In sealing the substrate with the cover plate, it is preferable to solder them in such a manner that each groove 1 is blocked, but it is also allowable that at least all the outer edges of the heat pipe array 6' are soldered to ensure hermetical sealing as a whole. In this case the heat transport capacity of the heat pipe remains unchanged and the manufacturing steps can be simplified.

The cooling device for laser diodes according to the first embodiment is provided with a built-in heat pipe or pipes formed with the grooves of 50 μm wide and 300 μm deep having a high heat transport capability, which are located in close proximity to the laser diode, so that it can provide an efficient cooling capability for a large amount of heat generated by a microscopic light-emitting spot of the laser diode and ensures a reliable and high-power laser beam.

Figure 3:
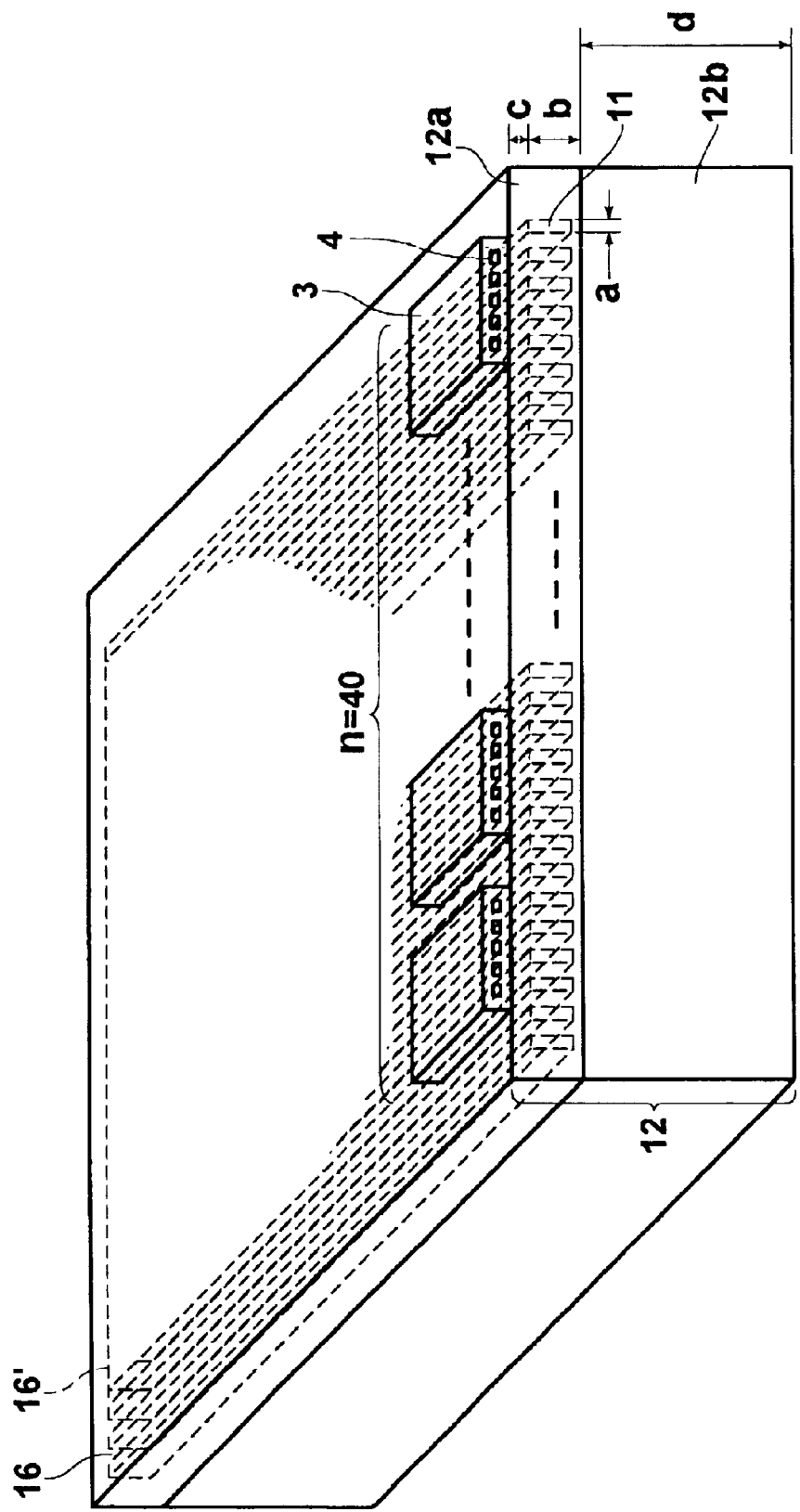
FIG. 3 is a perspective view illustrating a schematic configuration of a cooling device for laser diodes according to a second embodiment of the invention.
Figure 4A:
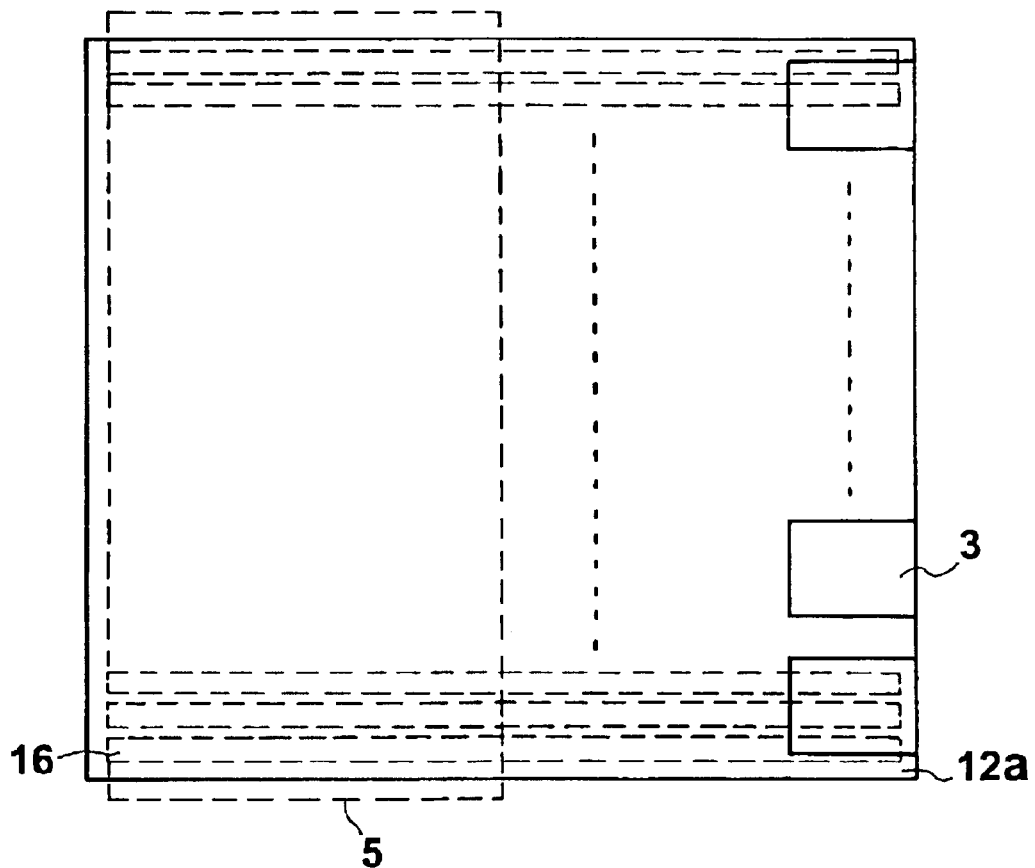
FIG. 4A is a top view and FIG. 4B is a side view illustrating a schematic configuration of a cooling device for laser diodes according to a second embodiment of the invention.
Figure 4B:
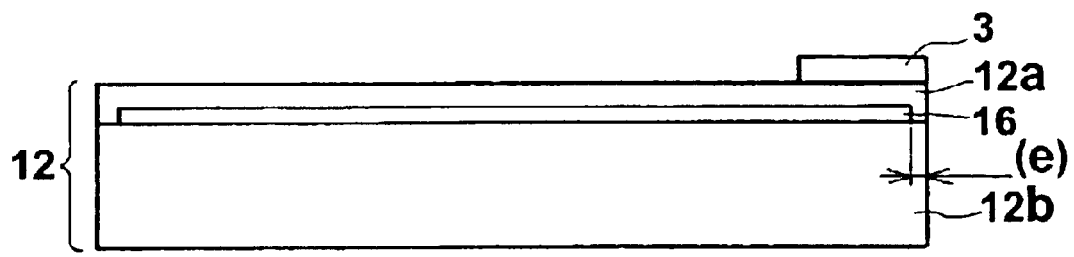

Next, the description of the cooling device for laser diodes in accordance with a second embodiment of the present invention will be provided herein below. FIG. 3 is a perspective view illustrating a schematic configuration of the cooling device for laser diodes of the second embodiment. FIG. 4A is a top view and FIG. 4B is a side view thereof. In the FIGS. 3, 4A and 4B, the components identical to those used in the first embodiment are indicated by the same reference number and will not be elaborated upon further.

As shown in FIG. 3, the cooling device for laser diodes of the second embodiment comprises a stem 12 which comprises a substrate 12a (approximately 400 μm thick) made of Cu having, on its bottom surface, an array of parallel grooves 11, which extend in the direction of the resonator length of the laser diode device 3 with a width (a) of 50 μm and a depth (b) of 300 μm, and a Cu cover block 12b of 20 mm thickness (d), which is hermetically sealed on the grooved surface by, e.g. soldering. The groove 11 contains deionized water as a working fluid filled therein under reduced pressure, thus forming a heat pipe 16. Forty laser diode devices 3 made of GaN semiconductor each having five light-emitting areas 4, each of which has an optical power of 100 mW, are mounted on the upper surface of the substrate 12a with junction-down, forming a bar laser with a total output of approximately 20 W. As a whole, the cooling device is structured in a heat pipe array 16' composed of a plurality of heat pipes 16 formed in parallel within the stem 12. The grooves 11 are created so that the distance between the bottom of the grooves 11 and the upper surface of the substrate 12a is 100 μm (c) and, as shown in FIG. 4B, is located as close as 100 μm (e) to the lateral face of the substrate 12a on the side closer to the laser emitting face of the laser diode device 3 to locate the grooves 11 in close proximity to the light-emitting spot of the laser diode device 3.

In the cooling device for laser diodes of the second embodiment, an array of grooves are created on the bottom surface of the substrate 12a so that they can be formed in extreme proximity to the laser diode device 3 by an accurately controlled etching technique, thereby the heat generated by the laser diode can be efficiently transmitted to the heat pipe, thus enabling the cooling device to provide a high heat dissipation capability. Also, the cooling device of the second embodiment has a larger inner surface area than the cooling device of the first embodiment so that it can provide greater heat transport capacity. Further, the laser diode device 3 is mounted on the upper surface of the substrate 12a, that is, the surface having a high flatness level can be used as the surface for mounting the laser diode device 3 so that an accurate laser beam can be obtained.

Figure 5A:
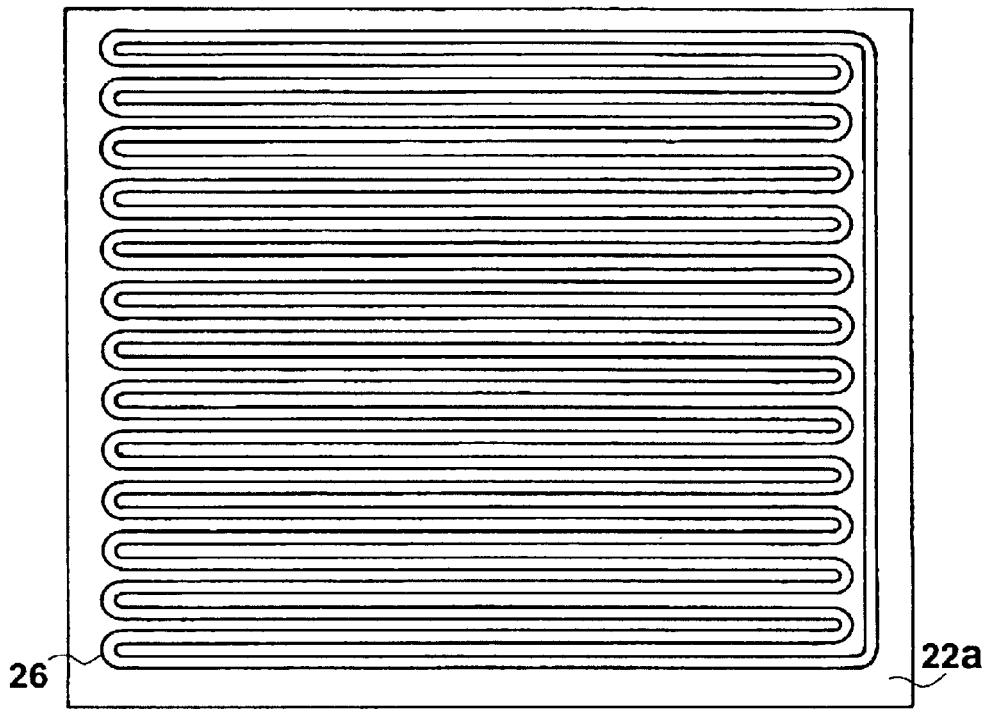
FIG. 5A is a top view and FIG. 5B is a side view illustrating a schematic configuration of a cooling device for laser diodes according to a third embodiment of the invention.

Next, the description of the cooling device for laser diodes in accordance with a third embodiment of the present invention will be provided herein below. FIG. 5A is a top view and FIG. 5B is a side view with a laser diode device mounted thereon.

Figure 5B:
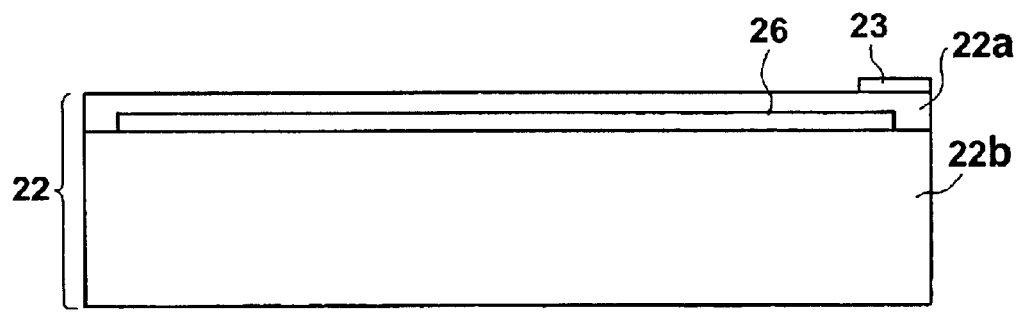

As shown in FIG. 5B, the cooling device for laser diodes according to the third embodiment comprises a stem 22 which comprises a substrate 22a having a tortuous groove created by the similar method as explained in the second embodiment on its bottom surface to form a heat pipe 26 and a cover block 22b for hermetically sealing the grooved surface. A laser diode device 23 is mounted on the upper surface of the substrate 22a and a working fluid is filled and hermetically sealed by the cover block 22b. The heat transport capacity of the cooling device of the third embodiment can be increased three-fold by forming the heat pipe 26 as a tortuous path through which the working fluid flows back as shown in FIG. 5A when compared with a cooling device with parallel bar-shaped heat pipes.

Figure 6:
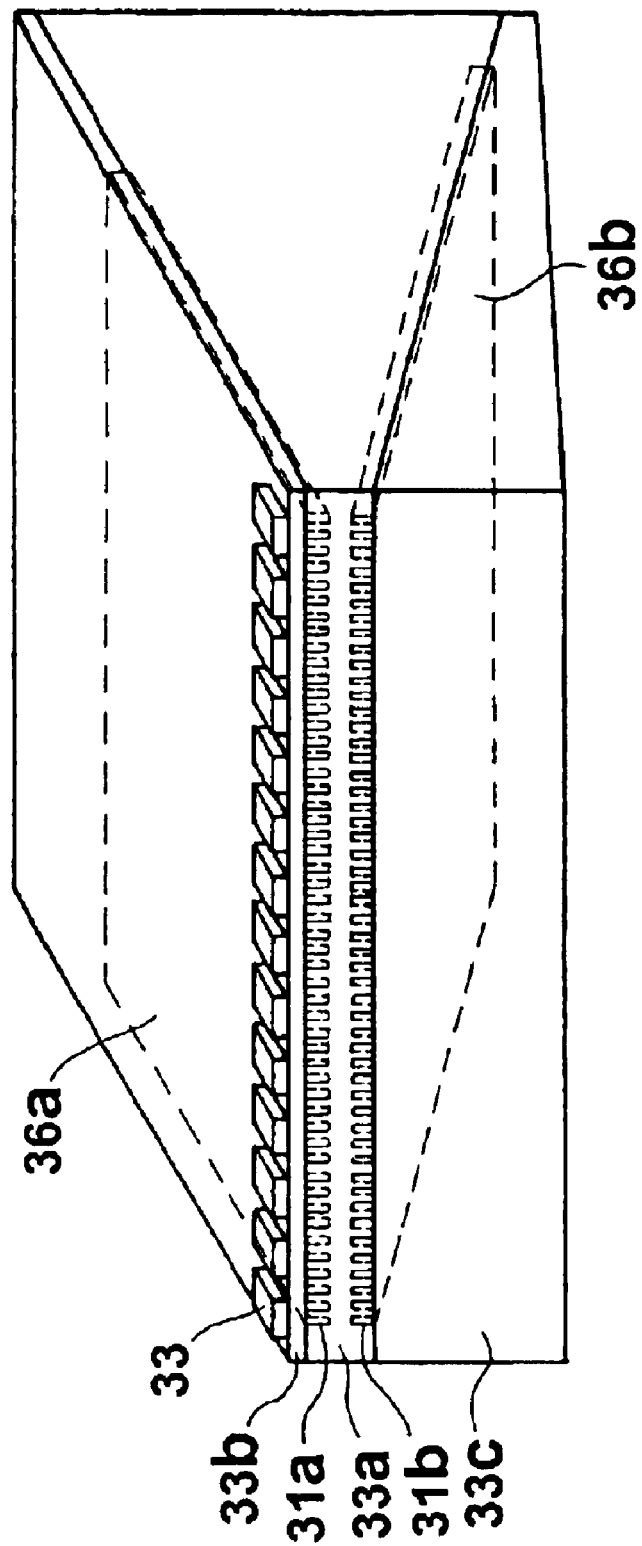
FIG. 6 is a perspective view illustrating a schematic configuration of a cooling device for laser diodes according to a fourth embodiment of the invention.

Next, the description of the cooling device for laser diodes in accordance with a fourth embodiment of the present invention will be provided. FIG. 6 is a schematic diagram of the cooling device for laser diodes of this embodiment.

As shown in FIG. 6, the cooling device for laser diodes of the fourth embodiment comprises heat pipe arrays 36a and 36b comprising grooves 31a and grooves 31b created on the sloped upper and bottom surfaces of a substrate 33a, which extend in the direction of the resonator length of the laser diode device 33, wherein a working fluid is filled under reduced pressure and hermetically sealed by a cover plate 33b and a cover block 33c respectively.

As shown in this embodiment, by forming two heat-pipe arrays in a radial pattern so that the low temperature sections of each heat pipe array are separated further apart, the heat transport capacity of each of the arrays can be fully demonstrated.

Locating the low temperature section above the heated section provides an efficient flow-back of the working fluid due to gravity, thereby heat transport capacity can be increased.

Also, two or more heat pipe arrays comprising parallel heat pipes may be formed in layers, in which case the heat dissipation capability can be increased compared with a single layered heat pipe array.

Further, the heat transport capacity may be increased by providing a means, such as an ultrasonic vibrator for vibrating the low temperature section of the heat pipe or pipes to facilitate the flow-back of the working fluid.

The laser diode device may either be mounted with junction-up or junction-down. In a junction-down mounting, however, the heat generation point is located closer to the heat pipe, thereby further improving heat dissipation, and a more reliable laser beam can be obtained.

In the preferred embodiments, Cu is used as the material for the structures, such as the stem. However, Si, Sic, AlN or WCu may also be used. When Si, Sic or AlN is used, soldering spots are metalized, e.g. with Ti, Pt, or Au.

As the working fluid, deionized water is preferable which can be used in the wide temperature range from 5 to 200° C. In addition to the deionized water, hydrocarbon families including ethanol, methanol and acetone or CFC substitutes including HCFC and HFC which have low reactivity and high safety properties may be used. In selecting a heat pipe material and a working fluid, it is preferable to give consideration to their compatibility.

In the first and second embodiments, heat pipes formed with grooves of 50 μm wide and 300 μm deep are introduced as an example, it is preferable that both the width and depth of the grooves are between 30 to 400 μm. It is further preferable that the width of the grooves is between 30 to 100 μm and in which case, the depth of the grooves is between 100 to 400 μm.

If the heat pipes are too small, the resistance of the inner wall of the heat pipes increases and the fluidity of the working fluid inside the grooves is hindered. It is preferable, therefore, that both the width and depth of the grooves are not smaller than 30 μm to facilitate the fluidity of the working fluid inside the grooves.

It is also preferable that the heat pipe having a heat dissipation capability ten times that of Cu per unit cross-sectional area is located in utmost proximity to the heat source. A larger cross-sectional area of the heat pipes requires the structure design with thicker walls in the vicinity of the heat pipes, which keeps the heat pipes away from the heat source, thus resulting in an inefficient heat dissipation capability. In particular, the cooling device for a high-power laser diode, the dissipation of the heat from the heat source spot is important. In order to locate the heat pipe or pipes in close proximity to the laser diode with a distance of approximately 300 μm or less, it is preferable that both the width and the depth of the grooves do not exceed 400 μm.

Further, it is preferable that the width of the grooves is greater than or equal to 30 μm to allow a plurality of grooves to be created in parallel so that high heat dissipation can be obtained and to ensure the fluidity of the working fluid inside the grooves. In addition, it is preferable that the width of the grooves does not exceeds 100 µm to prevent strain from developing on the surface of the structure on which the laser diode is mounted. At the same time, it is preferable that the depth of the grooves is between 100 to 400 µm to provide a wider specific surface area to which a unit mass of the working fluid contacts, thereby ensuring increased flow-back efficiency. Within the preferable dimensional ranges for the grooves described above, it is preferable that appropriate dimensions are determined for the grooves in accordance with an application with the consideration of the material of the heat pipe and the working fluid to be employed as well as the amount of heat generation in order to ensure a high heat transport capacity.

Figure 7:
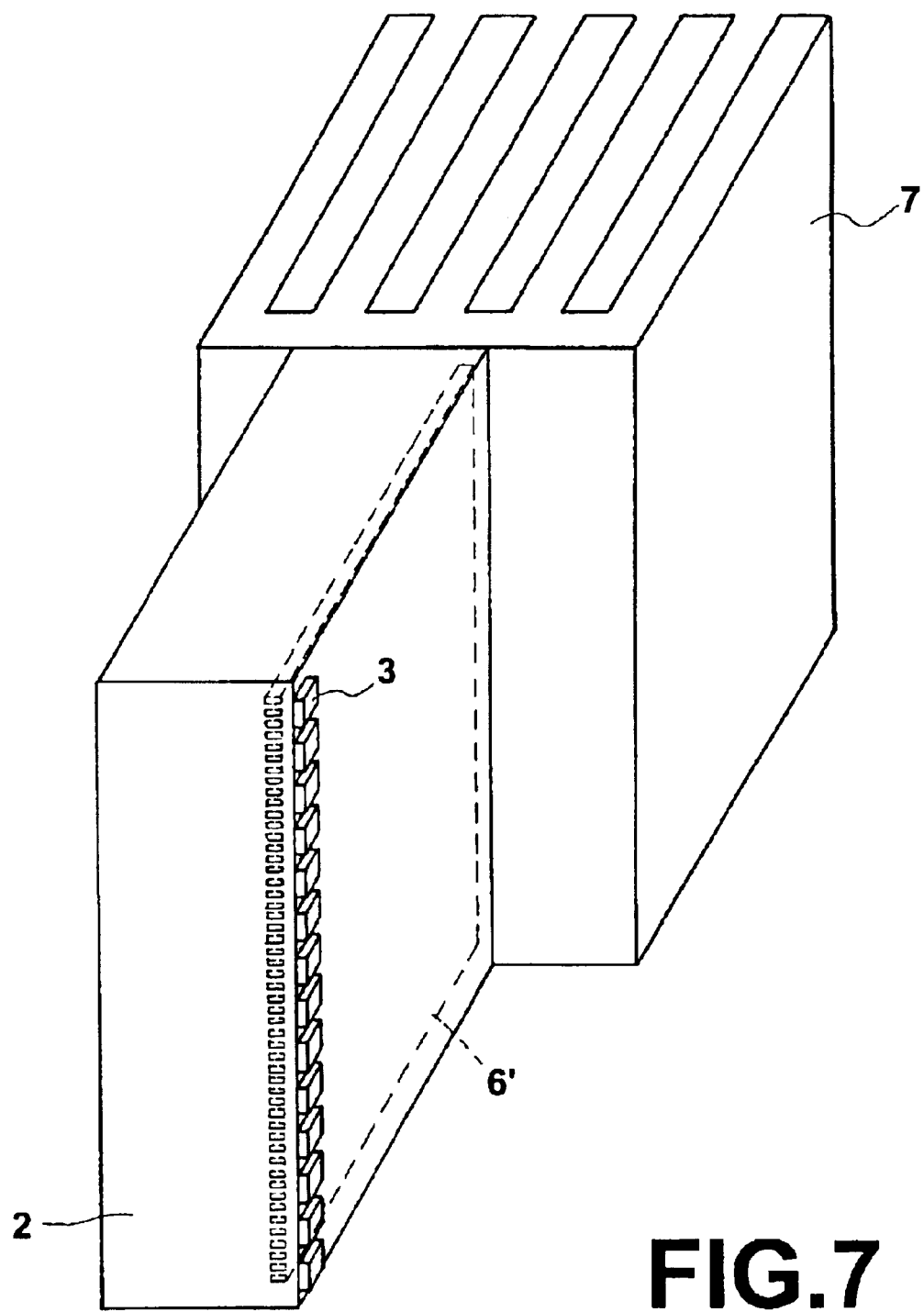
FIG. 7 is a perspective view of the present invention with a heat-sink.

As shown in FIG. 7, it is further preferable that the cooling device for laser diodes according to the present invention is packaged with a heat-sink 7 connected to the lateral face closer to the low temperature section of the heat pipe array 6'.

Figure 8:
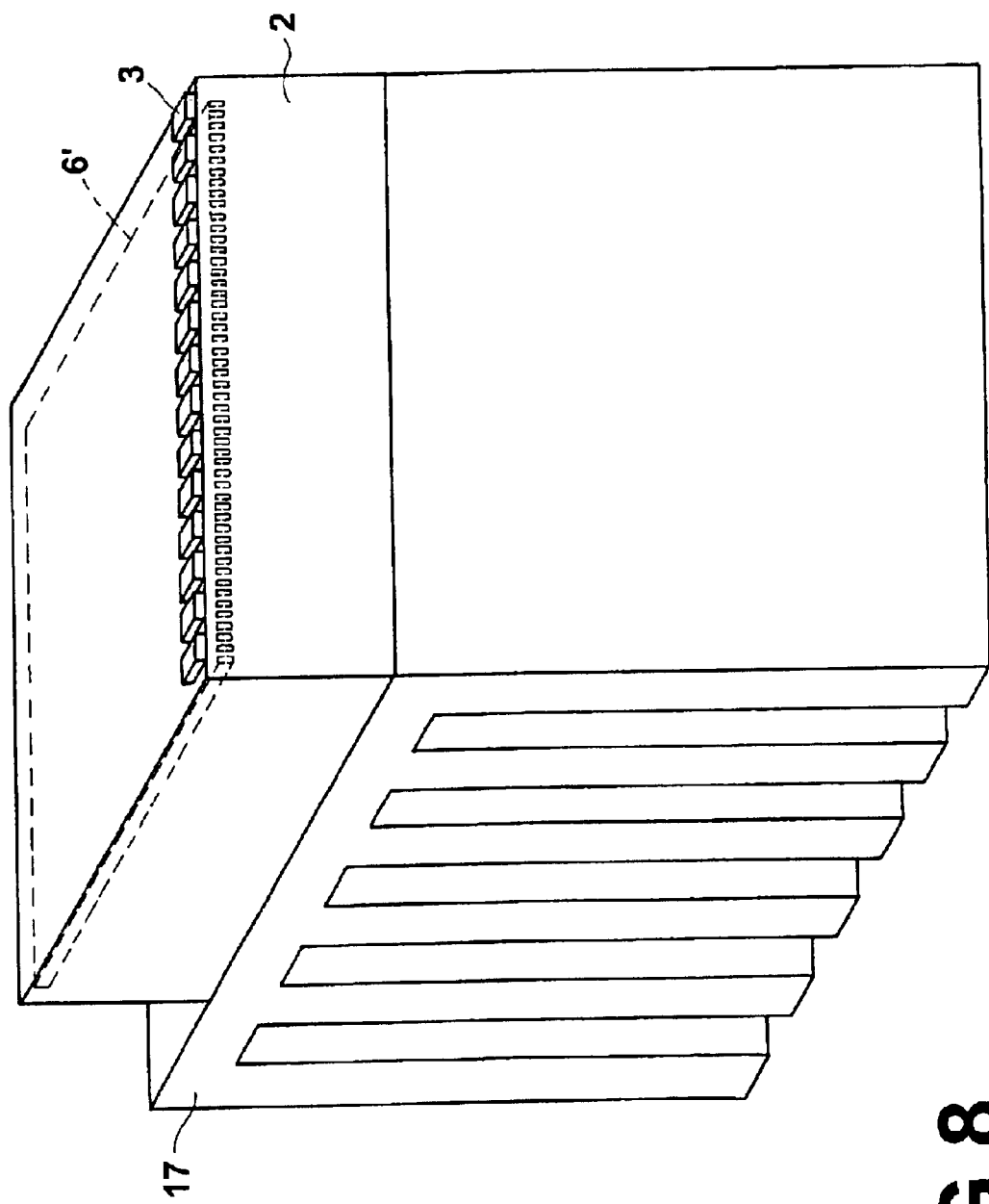
FIG. 8 is a perspective view of the present invention with a heat-sink.

Also, as shown in FIG. 8, a heat-sink 17 maybe attached to the surface of the stem 2 opposite to the surface on which the laser diode device 3 is mounted.

Figure 9:
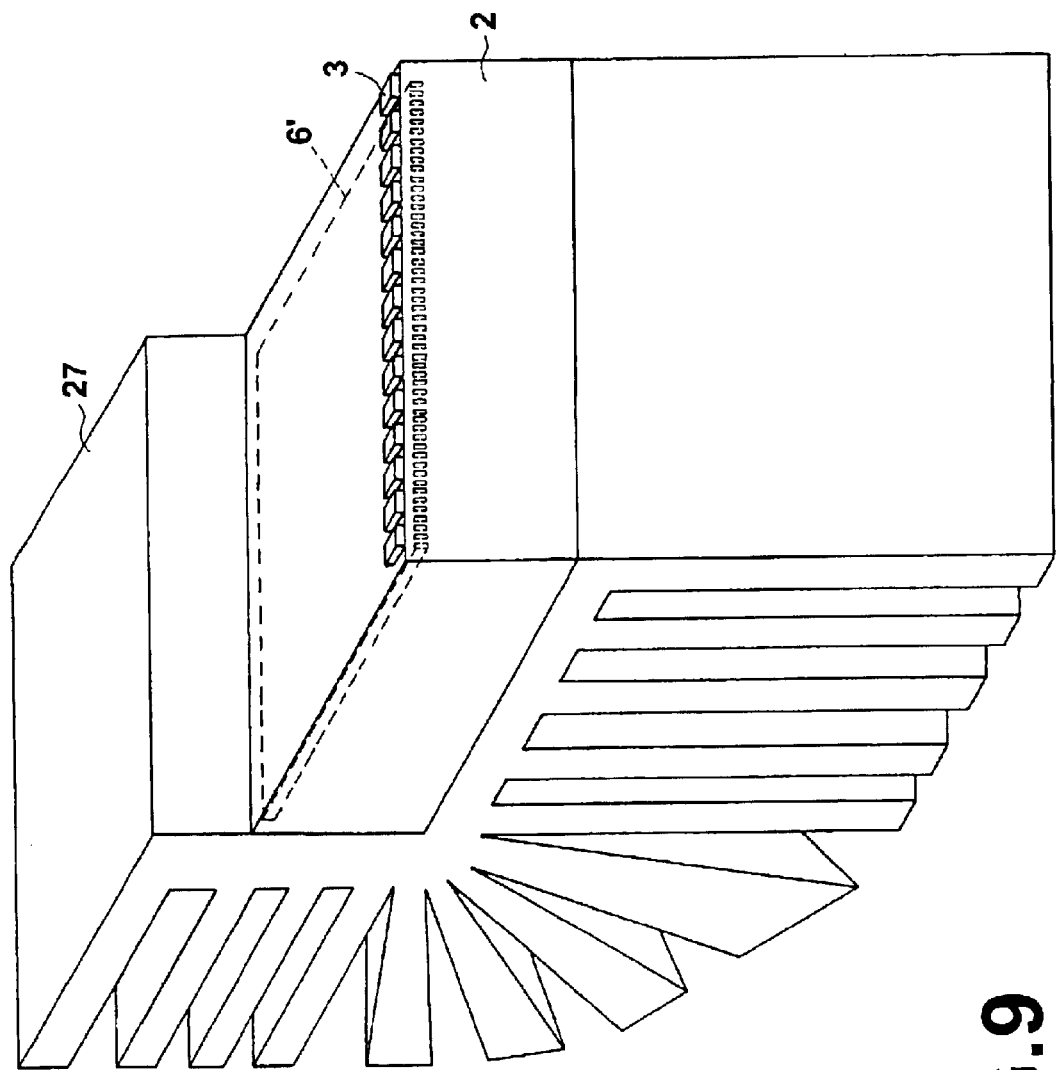
FIG. 9 is a perspective view of the present invention with a heat-sink.

Alternatively, as shown in FIG. 9, a heat-sink 27 with fins surrounding the lateral face closer to the low temperature section of the heat pipe array 6' attached to the bottom surface of the stem 2 may also be used.

Further, a forced air or water cooling mechanism may be used in conjunction with a heat-sink. Furthermore, a forced water cooling pipe may be built into a stem.

The cooling device for laser diodes according to the present invention has a heat pipe or pipes of high heat transport capacity located in close proximity to a laser diode inside a structure, e.g. a stem so that it can efficiently dissipate high density heat generated by the laser diode and increase the reliability and output of the laser diode.

What is claimed is:

1. A cooling device for laser diodes comprising a structure on which at least one laser diode is directly mounted, wherein said structure has therein a heat pipe or pipes made of microscopic fluid channels located in close proximity to the laser diode, and wherein the structure comprises:

a substrate having an array of microscopic parallel grooves thereon; and a cover plate for hermetically sealing the grooved surface to form a heat pipe or pipes and for mounting the laser diode thereon.

2. A cooling device for laser diodes according to claim 1, wherein the cover plate has a thickness of 300 µm or less.

3. A cooling device for laser diodes according to claim 1, wherein the cover plate has a thickness of 100 µm or less.

4. A cooling device for laser diodes of any of claims 1 to 10, wherein the grooves have both a width and a depth of between 30 µm to 400 µm.

5. A cooling device for laser diodes of any of claims 1 to 10, wherein the width of the grooves is between 30 to 100 µm and the depth of the grooves is between 100 to 400 µm.

6. A cooling device for laser diodes of any of claims 1 to 10, wherein the laser diode is a GaN semiconductor laser.

7. A cooling device for laser diodes of any of claims 1 to 10, wherein the laser diode has a plurality of light-emitting areas.

8. A cooling device for laser diodes of any of claims 1 to 10, wherein the laser diode has a broad light-emitting area.

9. A cooling device for laser diodes of any of claims 1 to 10, wherein a plurality of the laser diodes is mounted in parallel.

10. A cooling device for laser diodes comprising a structure on which at least one laser diode is directly mounted, wherein said structure has therein a heat pipe or pipes made of microscopic fluid channels located in close proximity to the laser diode, and wherein the structure comprises:

a substrate having an array of microscopic parallel grooves on its bottom surface, with the distance between the bottom of the grooves and the upper surface of the substrate being less than or equal to 300 µm, and the laser diode is mounted thereon; and a cover block for hermetically sealing the grooved surface to form the heat pipe or pipes.

* * * * *